United States Patent [19]
Theus et al.

[11] Patent Number: 5,805,029
[45] Date of Patent: Sep. 8, 1998

[54] DIGITALLY ADJUSTABLE CRYSTAL OSCILLATOR WITH A MONOLITHIC INTEGRATED OSCILLATOR CIRCUIT

[75] Inventors: Ulrich Theus, Gundelfingen; Norbert Greitschus, Freiburg, both of Germany

[73] Assignee: ITT Manufacturing Enterprises, Inc., Wilmington, Del.

[21] Appl. No.: 861,605

[22] Filed: May 22, 1997

[30] Foreign Application Priority Data

May 25, 1996 [DE] Germany ............... 196 21 228.6

[51] Int. Cl.⁶ ............... H03B 5/36; H03L 7/099
[52] U.S. Cl. ............... 331/116 FE; 331/36 C; 331/158; 331/175; 331/179; 331/182; 331/44
[58] Field of Search ............... 331/36 C, 44.56, 331/117 R, 117 FE, 116 R, 116 FE, 116 D, 108 A, 108 C, 158, 175, 179, 182

[56] References Cited

U.S. PATENT DOCUMENTS

| 4,814,640 | 3/1989 | Miyake | 307/303 |
| 5,142,251 | 8/1992 | Boomer | 331/179 X |
| 5,162,746 | 11/1992 | Ghoshal | 328/155 |
| 5,446,420 | 8/1995 | Westwick | 331/179 |

FOREIGN PATENT DOCUMENTS

| 0398331 | 11/1990 | European Pat. Off. . |
| 0431887 | 6/1991 | European Pat. Off. . |
| 0641080 | 8/1995 | European Pat. Off. . |

OTHER PUBLICATIONS

Kuboki, et al., Design Considerations for Low–Voltage Crystal Oscillator Circuit in a 1.8–V Single Chip Microprocessor, *IEICE Trans. Electron*, vol. E76–C, No. 5, pp. 701–707, May 1993.

Patent Abstracts of Japan, vol. 004, No. 59 (E–009) 2 May 1980 & JP 55 028632 A (Seiko Instr & Electronics Ltd), 29 Feb. 1980.

Patent Abstracts of Japan, vol. 017, No. 518, (E–1434), 17 Sep. 1993 & JP05 136707 A (Kokusai Electric Co Ltd), 1 Jul. 1993.

Copy of German Search Report, dated 22 Jan. 1997.

Copy of European Search Report for 97107250.9, dated May 09, 1997.

*Primary Examiner*—David Mis
*Attorney, Agent, or Firm*—Plevy & Associates

[57] ABSTRACT

The invention relates to a digitally adjustable crystal oscillator having a quartz crystal and a monolithic integrated oscillator circuit including a series combination of a first frequency-adjusting capacitor C1 and a second frequency-adjusting capacitor C2 connected in parallel with the quartz crystal and comprising parallel-connected first capacitance stages and parallel-connected second capacitance stages, respectively, and an inverter circuit connected in parallel with the quartz crystal and comprising a feedback resistor $R_K$, the output of the innverter circuit being connected to a load resistor. The inverter circuit comprises parallel-connected inverter stages, and switching elements are provided within the inverter stages and cqapacitor stages in such a way that a respective one of the inverter stages as well as a first capacitance stage $C_{1i}$ and a second capacitance stage $C_{2i}$ are switchable into or out of circuit by means of a control signal $I_i$.

8 Claims, 4 Drawing Sheets

5,805,029

DIGITALLY ADJUSTABLE CRYSTAL OSCILLATOR WITH A MONOLITHIC INTEGRATED OSCILLATOR CIRCUIT

FIELD OF THE INVENTION

The present invention relates to oscillator circuits and more particularly, to a digitally adjustable crystal oscillator having a monolithic integrated oscillator circuit.

BACKGROUND OF THE INVENTION

Oscillators are used in a wide variety of electronic circuit applications including generating system timing operations, syncrhonizing system clocks, performing signal tracking and switching functions and generating various frequencies for signal transmission and reception.

The prior art abounds with various types of oscillators and oscillator cirucit applications. The Pierce oscillator, for example, is a crystal oscillator which is operated in a parallel-resonant circuit. It is known from "Entwurf von Quarzoszillatoren", Bernd Neubig, UKW-Berichte 19 (1979), Nos. 2 and 3. Such an oscillator can be used to supply an integrated circuit with a stable frequency which is variable within a small range by the switchable frequency-adjusting capacitor. The high Q of the quartz crystal, its low aging rate and temperature drift and the high manufacturing accuracy are utilized to generate stable frequencies. Via a phase-locked loop, synchronization of the crystal oscillator with a predetermined frequency can be accomplished by switching the capacitors. The feedback resistor $R_K$ has a high value and serves to set the operating point of the inverter circuit. The value of the resistor R connected to the output of the inverter circuit is so chosen that the amplitude of the oscillator output is stable. It is dependent on the transconductance of the inverter circuit and the values of the frequency-adjusting capacitors C1, C2.

However, a major disadvantage of this oscillator circuit is that frequency changes are only possible to a small extent, because a frequency change, i.e., a change in the frequency-adjusting capacitances C1, C2, involves a change in the conditions for stable oscillation of the crystal oscillator, particularly for stable frequency and stable amplitude. Both the requirements for the transconductance of the inverter circuit and those for the resistor R connected to the output of the inverter circuit change. Consequently, an oscillator circuit operable to provide frequency changes over a greater frequency range while still providing stable oscillation is greatly desired.

SUMMARY OF THE INVENTION

It is an object of the present invention to provide a digitally adjustable crystal oscillator having a monolithic integrated oscillator circuit comprising a series combination of a first frequency-adjusting capacitor C1 and a second frequency-adjusting capacitor C2 connected in parallel with a quartz crystal, at least one of the frequency-adjusting capacitors being digitally switchable, and an inverter circuit connected in parallel with the quartz crystal and comprising a feedback resistor $R_K$, the output of the inverter circuit being connected to a load resistor R. This object is attained by a crystal oscillator of the above kind wherein the inverter circuit comprises parallel-connected inverter stages, wherein the first frequency adjusting capacitor C1 comprises parallel-connected first capacitance stages, wherein the second frequency adjusting capacitor C2 comprises parallel-connected second capacitance stages, and wherein switching elements are provided such that a respective one of the inverter stages and a first capacitance stage and a second capacitance stage are switchable into or out of circuit simultaneously by means of a control signal. Since an inverter stage is switched into or out of circuit simultaneously with the switching into or out of circuit of the capacitance stages causing the frequency change, the transconductance is adapted to the changed frequency simultaneously with the frequency change. Thus, stable oscillation of the crystal oscillator is possible over a wider frequency range.

BRIEF DESCRIPTION OF THE DRAWINGS

The invention is to be explained in more detail below with reference to the accompanying drawings, in which.

DETAILED DESCRIPTION OF THE INVENTION

Figure 1:
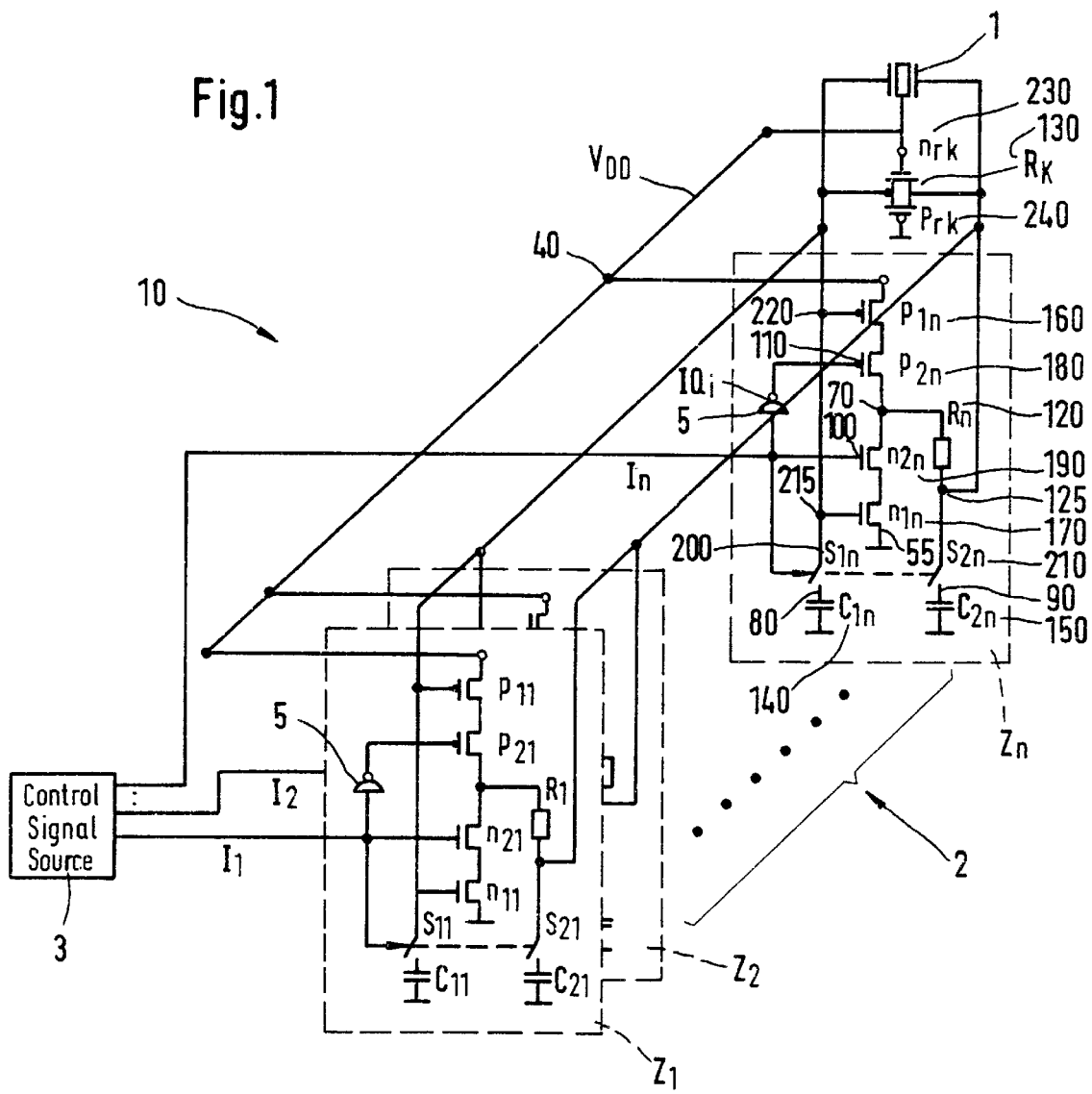
FIG. 1 shows a first embodiment of the crystal oscillator according to the invention.

Referring to FIG. 1, a crystal oscillator 10 comprising a quartz crystal 1 and an oscillator circuit 2 is shown. In the preferred embodiment, the oscillator circuit 2 is integrated on a semiconductor chip in CMOS technology. The quartz crystal 1 is located outside the chip. Connected in parallel with the quartz crystal 1 are n basic cells $Z_1, \ldots, Z_n$, (although only cells #1 and #n are illustrated for the sake of clarity) with a feedback resistor $R_K$ (ref. numeral 130) connected in parallel. Each cell $Z_i$ of the array of cells comprises two capacitance stages having two capacitors $C_{1i}$, $C_{2i}$ (ref. numerals 140, 150) connected in parallel with quartz crystal 1, and each having one terminal coupled to ground potential. Each basic cell $Z_i$ further includes a corresponding inverter stage connected in parallel with quartz crystal 1. Each inverter stage comprises two series-connected amplifying transistors $p_{1i}$, $n_{1i}$ (ref. numerals 160, 170) of opposite conductivity types. Amplifying transistor $p_{1i}$ has a terminal 30 connected to a fixed potential supply voltage $V_{DD}$ at node 40, while amplifying transistor $n_{1i}$ has terminal 50 connected to ground. Each of the amplifying transistors $p_{1i}$, $n_{1i}$ has a corresponding switching transistor $p_{2i}$, $n_{2i}$ (ref. numerals 180, 190) of the same conductivitiy type connected in series operable as switching devices. A resistor $R_i$ (ref. numeral 120) is connected to the output of the inverter stage at node 70. The first capacitor $C_{1i}$ has a terminal 80 connected to the interconnected gate electrodes of the amplifying transistors $p_{1i}$ and $n_{1i}$ at nodes 215 and 220 via switch $S_{1i}$ (ref. numeral 200). The second capacitor $C_{2i}$ has a terminal 90 connected to resistor $R_i$ at node 125 via a second switch $S_{2i}$ (ref. numeral 210). Control signal source 3 provides control signals $I_i, \ldots, I_n$ to control the opening and closing of each of the switches within oscillator 10. With each control signal $I_i$, the switches $S_{1i}$, $S_{2i}$ of the respective basic cells $Z_i$ are closed. At the same time, switching transistor $n_{2i}$ is turned on by applying control signal $I_i$ at terminal 100, while switching transistor $p_{2i}$ is turned on by applying inverted signal $IQ_i$ at terminal 110. This signal obtained by inverting the control signal $I_i$ with inverter 5. The number of closed switches $S_{1i}$, $S_{2i}$ in the basic cells $Z_i$ determines the effective load capacitance of the quartz crystal 1, and thus the resonant frequency of the crystal oscillator. To achieve stable oscillation at a given resonant frequency, the transconductance must be adapted to the respective resonant frequency. This is accomplished by turning on the switching transistors $p_{2i}$, $n_{2i}$ with the common control signal $I_i$, $IQ_i$ at the same time the capacitors $C_{1i}$, $C_{2i}$ are switched into circuit. Thus, the respective inverter stage and the resistor $R_i$ following that stage are switched into circuit simultaneously with the capacitors. The inverter stage ensures a suitable gain at the changed resonance frequency, and the resistor $R_i$ ensures a constant amplitude of oscillation. The value of the resistor $R_i$ is chosen depending on the gain of the inverter stage and, thus, on the capacitance stages and the values of the amplifying transistors $n_{1i}$, $p_{1i}$ so that a constant amplitude of oscillation is achieved.

The feedback resistor $R_K$ includes two complementary feedback transistors $p_{rK}$ and $n_{rK}$ (ref. numerals 230 and 240). The feedback resistor sets the operating point of each basic cell $Z_i$. Switches $S_{1i}$, $S_{2i}$ may be implemented with complementary transistors which are supplied with control signal $I_i$ and inverted control signal $IQ_i$.

Figure 2:
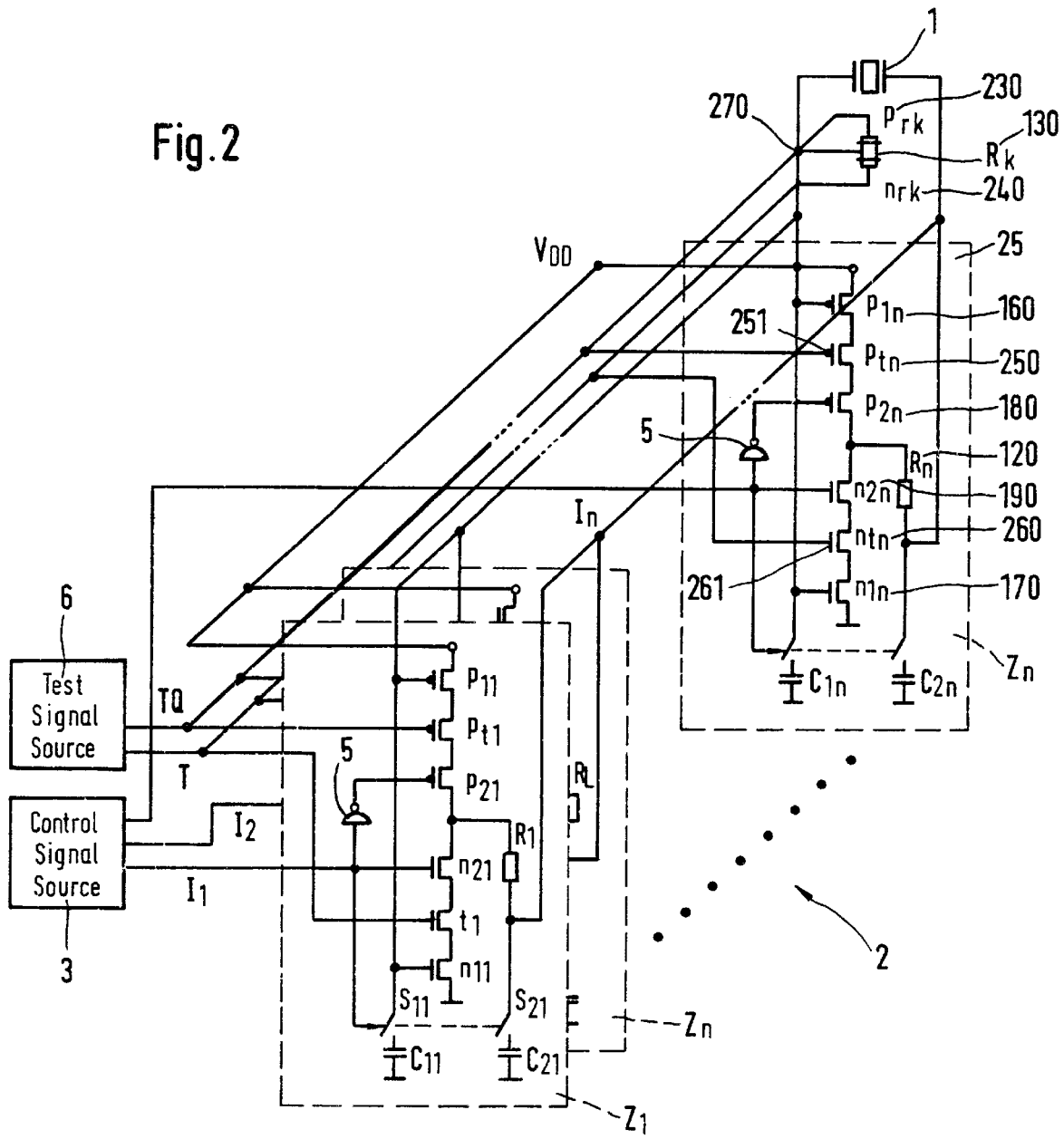
FIG. 2 shows a second embodiment of the crystal oscillator according to the invention.

FIG. 2 shows a second embodiment of the crystal oscillator according to the invention. Like reference characters have been used to designate parts having the same functions as in FIG. 1. Therefore, only the changes will be described in the following. The inverter stage 25 of each basic cell $Z_i$ includes two test transistors of opposite conductivity types $p_{ti}$, $n_{ti}$ (ref. numerals 250, 260) connected in series between the respective amplifying transistor $p_{1i}$, $n_{1i}$ and the respective switching transistor $p_{2i}$, $n_{2i}$ of the same conductivity type. Test signal source 6 applies signals TQ and T to the gate electrodes 251 and 261 of the test transistors $p_{ti}$ and $n_{ti}$ to control the transistors. Test signal source 6 is also connected to feedback resistor $R_K$ at node 270. The test signals TQ and T also drive the gate electrodes of the feedback resistor transistors $p_{rk}$ and $n_{rk}$, respectively, of the feedback resistor $R_K$. The crystal oscillator can be switched via the test signals into either a normal state, in which it oscillates, or a test state. In the normal state, the test signal source 6 provides the test signals TQ and T to test transistors $p_{ti}$, $n_{ti}$ and the feedback transistors $p_{rk}$, $n_{rk}$ to enable current conduction. The operation of the oscillator in the normal state thus corresponds to the operation of the oscillator as in FIG. 1. In the test state, the test signal source 6 applies test signals TQ and T to test transistors $p_{ti}$, $n_{ti}$ and feedback transistors $p_{rk}$, $n_{rk}$ in order to disable them. In that case, the respective inverter stages are currentless and the feedback path is open, since the feedback resistor is switched out of the circuit. In this state, the capacitances $C_{1i}$ and $C_{2i}$ are switched into circuit via switches $S_{1i}$ and $S_{2i}$, respectively, and their leakage currents can be measured without affecting the other circuit elements. Thus, by switching the transistors via the test signals provided by test signal source 6, the feedback resistor $R_k$ is switchable into or out of circuit in a simple manner.

To summarize, test signal source 6 is operable such that by means of a test signal provided by test signal source 6, the switching transistors are switchable into the conducting or nonconducting state and the feedback resistor $R_K$ is simultaneously switchable into or out of circuit. In this manner, the crystal oscillator can be switched with the test signal into either a normal state, in which it oscillates, or a test state. For the normal state, the test switching transistors are switched into the conducting state by the test signal, and the feedback resistor is switched into circuit, so that the crystal oscillator will oscillate at its resonant frequency. For the test state, the switching transistors 180, 190 are switched into the nonconducting state with the test signal, and the feedback resistor is disconnected. Thus, the respective inverter stage becomes currentless, and the feedback is interrupted. In this state, the capacitors of the inverter stages can be switched into circuit via the associated switching elements. In the test state, the leakage currents of the capacitors of the inverter stages can be measured. This is only possible in the test state, since in the normal state the capacitors are connected through the resistor $R_i$ to the output of the cascade stages of the respective inverter stage. In addition, this connection extends via the feedback path with the feedback resistor $R_K$, so that the current would flow in the entire oscillator circuit. As a test can be performed to ascertain whether the capacitors have leakage currents or not, it is possible to determine if the crystal oscillator meets the requirements of the user and the manufacturer. For many applications, freedom from leakage current is required for a long time. Thus, the test results can be used to determine whether the oscillator circuits are in a "go" or "no-go" state. Leakage currents may be caused particularly by poor properties of the oxide between the capacitor plates. The test for freedom from leakage current may be performed at a given voltage and a given temperature, from which long-term freedom from leakage current under normal conditions can be inferred.

Alternatively, this test state can also be implemented by connecting the lines carrying the control signals $I_i$ with the test signal T via a logic gate, such as an OR gate. The values of the resistors $R_i$ of this embodiment are chosen so as to take into account the resistances of the test transistors $n_{ti}$, $p_{ti}$ in their ON states. Therefore, the resistors $R_i$ in FIG. 2 have lower values than those in FIG. 1.

Figure 3:
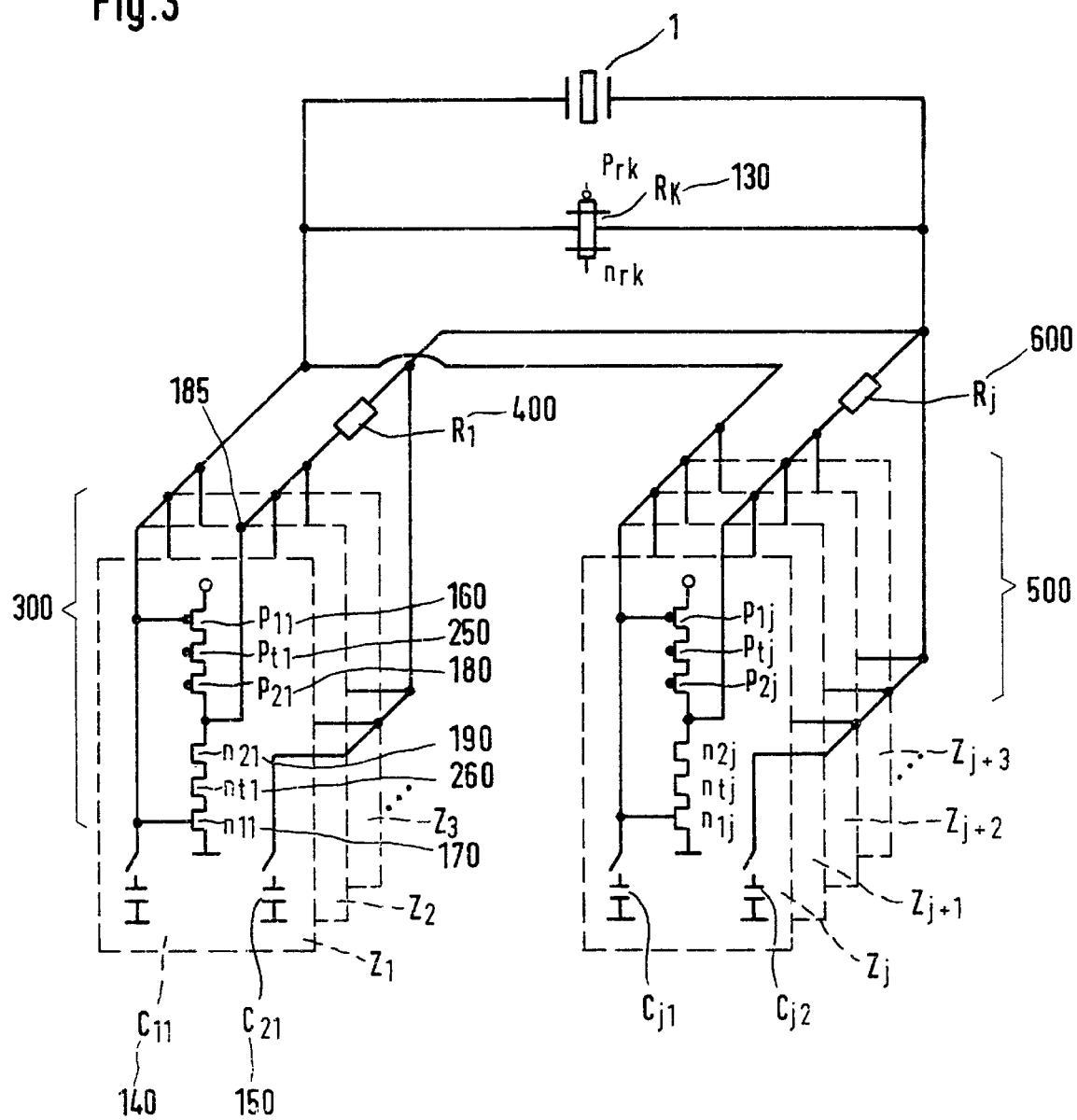
FIG. 3 shows a third embodiment of the crystal oscillator according to the invention.

A third embodiment of the present invention is illustrated in FIG. 3. Elements designated by the same reference characters as in FIG. 2 have the same functions as in FIG. 2. For the sake of simplicity and clarity, the control signal source, the supply voltage source, the test signal source, and the respective leads are not shown. They are implemented in a manner analogous to that in FIG. 2. In FIG. 3, a plurality of basic cells $Z_1$, $Z_2$, . . . , $Z_i$ and, hence inverter stages, are combined in a group 300, and a resistor $R_1$ (ref. numeral 400) is connected to the common output of the inverter stages of the group 300 of basic cells. The basic cells $Z_j$, . . . , $Z_{j+n}$ form a second group 500 of basic cells, whose output is followed by a resistor $R_j$ (ref. numeral 600). In this embodiment, the complexity and area of the IC are reduced, since a common resistor $R_1$, $R_j$ is used for a given number of basic cells. The respective test switching transistors 250, 260 are connected between associated amplifying transistors 160, 170 and associated switching transistors 180, 190. The switching transistors' output signal at node 185 of the respective inverter stage forms a high-value resistor in their OFF-state, so that the gate capacitance of the test switching transistors will not enter into the parallel-connected frequency-adjusting capacitance 140 and 150. In the conducting state, the gate capacitance is formed by the capacitance between the gate electrode and the existing channel between the drain and source regions. Since the test switching transistors are always conducting in the normal state of the crystal oscillator, they always have a gate capacitance in the normal state. Since the resistor R ensures a constant amplitude of oscillation, it must be suitably adapted in the event of a major frequency change, which is caused by switching different capacitances into circuit.

Figure 4:
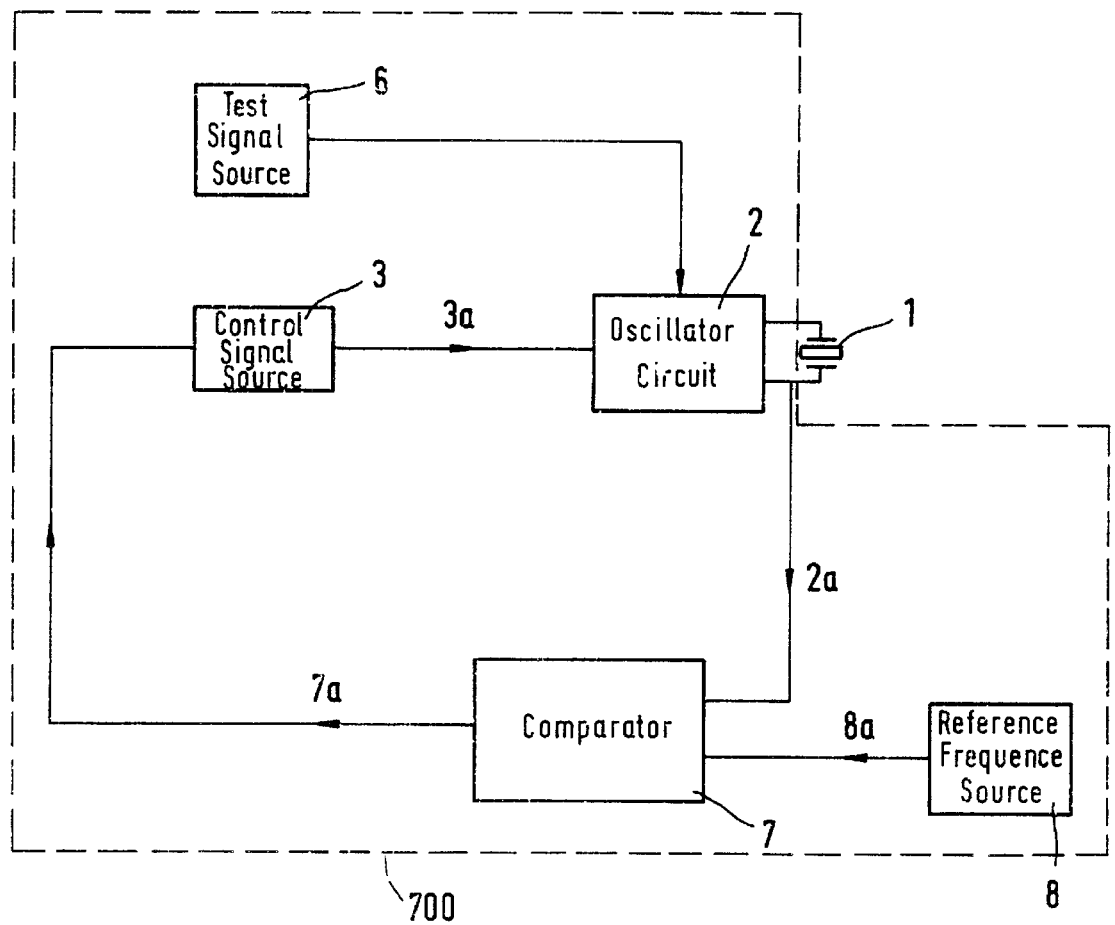
FIG. 4 is a block diagram showing a feedback control system which includes the crystal oscillator according to the invention.

FIG. 4 shows a block diagram of a preferred embodiment in which the crystal oscillator according to the invention is operated in a feedback control system. The quartz crystal 1 is located outside IC 700, and all other elements are integrated on the IC. An output signal 2a from oscillator circuit 2 is fed to comparator 7 where its frequency is compared with the frequency of a reference signal 8a from reference signal source 8. The output signal 7a from comparator 7 is is indicative of the difference between the frequencies of signal 2a from the oscillator circuit and reference signal 8a from reference frequency source 8. Output signal 7a is then applied to control signal source 3 to generate a digital signal 3a which is fed to the oscillator circuit 2. This signal determines which of the capacitances $C_{1i}$, $C_{2i}$ are switched into or out of circuit. In this manner, the frequency of the oscillator circuit 2 is changed. This control continues until comparator 7 detects agreement between the frequency of the signal 2a from the oscillator 2 and signal 8a from reference frequency source 8. When this value has been reached, the frequency of the oscillator circuit is held at this value. In that case, the test signal source 6 is in the normal state. It is only switched to the test state for testing the freedom of the capacitors from leakage current. In the preferred embodiment, the respective number of first capacitance stages and the respective number of second capacitance stages are greater than the number of inverter stages, and switching elements are provided such that a first capacitance stage and a second capacitance stage are switchable into or out of circuit via a control signal. Thus, a suitable number of capacitance stages can also be switched into or out of circuit without inverter stages. This is advantageous for frequency ranges in which the stability of the oscillator oscillation is not undesirably affected by a capacitance change. Capacitance stages with and without inverter stages can be switched into or out of circuit alternately.

What is claimed is:

1. A digitally adjustable crystal oscillator comprising:

a quartz crystal; and a monolithic integrated oscillator circuit comprising:

a series combination of a first frequency-adjusting capacitor and a second frequency-adjusting capacitor parallel coupled to said quartz crystal, at least one of said frequency-adjusting capacitors being digitally switchable, and an inverter circuit connected in parallel with said quartz crystal and comprising:

a feedback resistor $R_K$, a plurality of parallel-connected inverter stages, each said inverter stage including a pair of serially coupled amplifier transistors ($p_{1i}$, $n_{1i}$) of opposite conductivity, each said amplifier transistor serially coupled to a switching transistor ($p_{2i}$, $n_{2i}$) of the same conductivity, wherein the output of each said switching transisitor is serially coupled to a load resistor;

wherein said first frequency adjusting capacitor comprises a plurality of parallel-connected first capacitance stages, each having a first capacitor $C_{1i}$ and a first switching element $S_{1i}$ serially coupled to said pair of amplifier transistors, wherein said second frequency adjusting capacitor comprises a plurality of parallel-connected second capacitance stages, each having a second capacitor $C_{2i}$ and a second switching element $S_{2i}$ serially coupled to said load resistor, wherein at least one of said respective inverter stages and said first and second capacitance stages are switchable into and out of said circuit simultaneously in response to a control signal ($I_i$).

2. The crystal oscillator of claim 1, wherein each of said pair of amplifying transistors ($p_{1i}$, $n_{1i}$) of opposite conductivity types is coupled to respective fixed potentials.

3. The crystal oscillator of claim 2, further including a test signal source for generating test signals to provide selective switching, each of said inverter stages further including a pair of test switching transistors ($p_{ti}$, $n_{ti}$) serially coupled to said amplifying transistors ($p_{1i}$, $n_{1i}$) and to said switching transistors ($p_{2i}$, $n_{2i}$) of one conductivity type, each said test switching transistor ($p_{ti}$, $n_{ti}$) having the same conductivity type as the corresponding switching transistor, said test switching transistors responsive to said test signal to provide a state signal to said switching transistors ($p_{2i}$, $n_{2i}$), wherein said switching transistors responsive to said state signal are switchable into a conducting or nonconducting state, and wherein said feedback resistor $R_K$ responsive to said test signal is simultaneously switchable into or out of said circuit.

4. The crystal oscillator of claim 3, wherein said feedback resistor $R_K$ comprises a pair of complementary transistors ($p_{rK}$, $n_{rK}$), each said complementary transistor having a gate electrode coupled to said test signal source and responsive to said test signal to switch said feedback resistor into or out of said circuit.

5. The crystal oscillator of claim 3, wherein the respective test switching transistor ($p_{ti}$, $n_{ti}$) of each said inverter stage is coupled between said associated amplifying transistor ($p_{1i}$, $n_{1i}$) and said associated switching transistor ($p_{2i}$, $n_{2i}$) of the same conductivity type.

6. The crystal oscillator of claim 4, wherein the respective test switching transistor ($p_{ti}$, $n_{ti}$) of each said inverter stage is coupled between said associated amplifying transistor ($p_{1i}$, $n_{1i}$) and said associated switching transistor ($p_{2i}$, $n_{2i}$) of the same conductivity type.

7. The crystal oscillator of claim 1, wherein said load resistor comprises partial resistors ($R_i$), wherein each said partial resistor is coupled to the output of said at least one inverter stages.

8. The crystal oscillator of claim 1, wherein the respective number of said first capacitance stages and the respective number of said second capacitance stages are greater than the number of said inverter stages.

\* \* \* \* \*